United States Patent

Knudsen

Patent Number: 5,955,979
Date of Patent: Sep. 21, 1999

[54] SYSTEM AND METHOD FOR COMPENSATING FOR GLITCH ERRORS IN A D/A CONVERTER

[75] Inventor: Niels Knudsen, Austin, Tex.

[73] Assignee: National Instruments Corporation, Austin, Tex.

[21] Appl. No.: 08/929,707

[22] Filed: Sep. 15, 1997

[51] Int. Cl.$^6$ ................................................ H03M 1/06
[52] U.S. Cl. ............................................ 341/118; 341/144
[58] Field of Search ..................................... 341/118, 144, 341/120

[56] References Cited

U.S. PATENT DOCUMENTS

| | | | |
|---|---|---|---|
| 3,877,023 | 4/1975 | Spicer et al. | 341/118 |
| 4,198,608 | 4/1980 | Comley | 328/162 |
| 4,918,447 | 4/1990 | Michel | 341/144 |
| 5,101,205 | 3/1992 | Yasuda | 341/155 |
| 5,387,912 | 2/1995 | Bowers | 341/118 |
| 5,625,360 | 4/1997 | Garrity et al. | 341/144 |
| 5,646,620 | 7/1997 | Regier | 341/118 |

OTHER PUBLICATIONS

Candy, James C. and Temes, Gabor C., *Oversampling Delta–Sigma Data Converters*, 1992, pp. 192–195, 227–228.

*Primary Examiner*—Marc S. Hoff
*Attorney, Agent, or Firm*—Conley, Rose & Tayon; Jeffrey C. Hood

[57] ABSTRACT

A system and method for compensating for glitches in a D/A converter, particularly in systems where the glitch is not constant during the sample period. In the preferred embodiment of the invention, the system represents the glitch as a constant deviation during the sample period for the glitch. The system uses a compensation signal having a constant deviation with an area corresponding to the area of the glitch. This approximation in the frequency domain becomes more accurate for lower frequencies and is especially suitable in an over-sampled system. By treating and compensating the glitch as a constant deviation from the ideal signal during one sampling cycle, it is possible to cancel the spectral effects of the glitch at low frequencies. This approximation enables glitch compensation in a sampled signal.

23 Claims, 3 Drawing Sheets

SYSTEM AND METHOD FOR COMPENSATING FOR GLITCH ERRORS IN A D/A CONVERTER

FIELD OF THE INVENTION

This invention relates to the art of digital-to-analog (D/A) converters, and more particularly to a system and method for compensating for glitch errors in a D/A converter by modeling the glitch as a constant deviation during the sample period with the same area as the actual glitch.

DESCRIPTION OF THE RELATED ART

D/A converters are used in a wide variety of different applications involving waveform synthesis, DC control, voltage generation etc. D/A converters are also used in many different A/D converter topologies, for example in successive approximation converters and multi-bit sigma delta converters. In all of the above mentioned applications, the accuracy of digital to analog conversion is affected by parameters such as gain accuracy, offset accuracy, linearity errors (often measured as differential and integral non-linearities), and glitch errors.

In most applications the effect of these errors can be compensated for by special calibration circuitry. In A/D Converters, for example, the effect of errors can by compensated for or eliminated by a digital translation of the output of the converter. For more information on performing multi-bit linearization in A/D converters, please see U.S. patent application Ser. No. 08/772,785 titled "System and Method for Generating a Sigma-Delta Correction Circuit" and U.S. patent application Ser. No. 08/771,480 titled "System and Method for Reducing Errors in a Delta-Sigma Converter", whose inventor is Niels Knudsen, and which is assigned to National Instruments Corporation.

One of the most important dynamic errors which affects a D/A converter is glitch. Glitch in a D/A Converter is an unwanted signal that contributes to the overall distortion of the output signal. The source of glitch errors can be traced to the internal current generators of the multi-bit D/A converter. FIG. 1 shows, in schematic form, a simplified D/A converter 70 employing a number of internal current generators 72. Each of the internal current generators 72 is selectively connected to an output node 74 via switches 76. Each switch 76 contains an input configured to receive one bit of the digital code input to the D/A converter 70. For example, switch $S_{N-1}$ is controlled by the most significant bit of the inputted digital code. When the most significant bit is 1, the associated current generator is connected to summing node 74. Thus, given a particular digital input code, the output of one or more of the current generators 72 is connected to the summing node 74.

If the D/A converter 70 was ideal and contained ideal current generators, current would be generated therefrom in integer units. For example, if the D/A converter 70 of FIG. 1 was an ideal 3 bit D/A converter, and a digital code inputted thereto equaled 111, the three ideal internal current generators 72 would generate 4, 2, and 1 units of current, respectively. However, internal current generators are rarely ideal.

The glitch signal in a D/A converter originates from the internal time skew between turn on and turn off times of the internal current generators of the D/A converter. The glitch produced by a D/A converter is deterministic (100% predictable) and is normally measured by its area and specified in pico-Volt-Seconds (pVsec). Thus glitch is predictable from the knowledge of the digital input to the converter and results in a voltage spike for a short amount of time. In general, the glitch signal depends on the code change between a current code of a current sample and a code of an immediately prior sample. For certain code changes, such as a transition from 01111111 to 10000000, the glitch signal can be fairly large, primarily due to the large number of switches or changes in the current generators.

Glitch is commonly characterized by the area of the glitch (measured in units of pVsec). In a sampled system it is difficult to understand signals (as glitches), that do not remain constant during the sample period. Therefore, an improved system and method is desired for compensating for glitches in systems where the glitch is not constant during the sample period. More generally, a D/A converter is desired in which the glitch signal produced by the D/A converter is removed or otherwise reduced.

SUMMARY OF THE INVENTION

The present invention comprises a system and method for compensating for glitches in a D/A converter, particularly in systems where the glitch is not constant during the sample period. In the preferred embodiment of the invention, the system models the glitch as a constant deviation during the sample period for the glitch. The system uses a compensation signal having a constant deviation with an area corresponding to the area of the glitch. This approximation in the frequency domain becomes more accurate for lower frequencies and is especially suitable in an oversampled system. By treating and compensating the glitch as a constant deviation from the ideal signal during one sampling cycle, it is possible to cancel the spectral effects of the glitch at low frequencies. This approximation enables glitch compensation in a sampled signal.

The method for compensating for glitch errors in a D/A converter first comprises receiving a plurality of samples of a digital signal which are to be provided to the D/A converter, wherein each sample comprises a code. The method then examines the code change between a current sample code and a code of an immediately prior sample. If the method determines that the current sample applied to the D/A converter will result in a glitch, then the method adjusts the output signal from the D/A converter to compensate for the glitch. This adjustment comprises generating a compensation signal that has a level difference which corresponds to the area of the glitch, and then summing the compensation signal with the output signal. This operates to modify a level of the output signal with a level difference that corresponds to the area of the glitch.

BRIEF DESCRIPTION OF THE DRAWINGS

A better understanding of the present invention can be obtained when the following detailed description of the preferred embodiment is considered in conjunction with the following drawings, in which.

Figure 1:
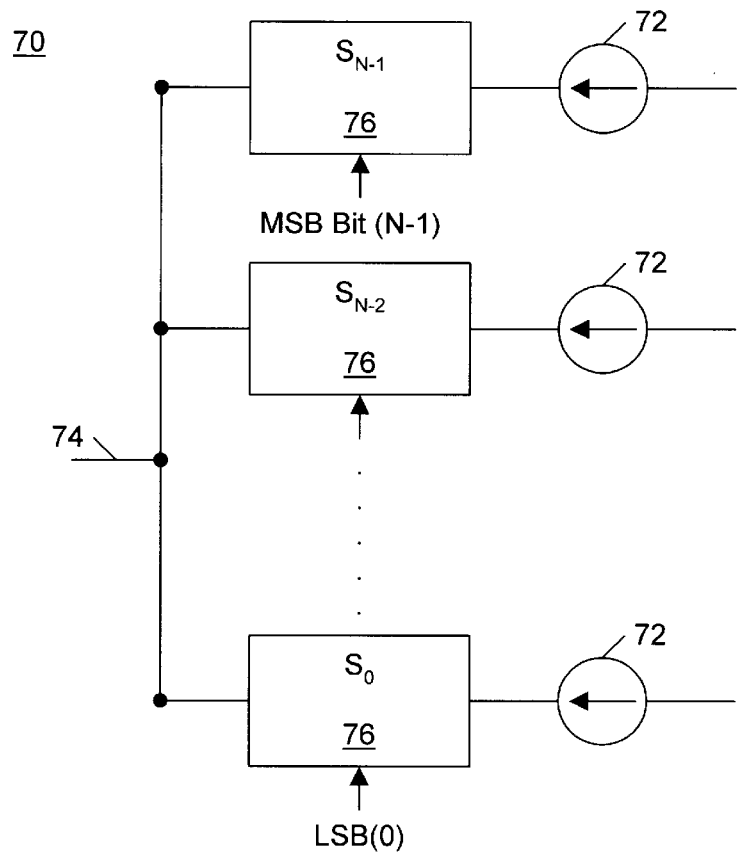
FIG. 1 illustrates a prior art D/A converter in schematic form.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

The present invention comprises a system and method for compensating for glitch in a D/A converter. The present invention operates to model the glitch as a constant deviation from the ideal signal during one sampling cycle. The compensation signal is designed to include the same area as the glitch itself. It is thus possible to cancel the spectral effects of the glitch at low frequencies. This approximation enables glitch compensation in a sampled signal.

Figure 2:
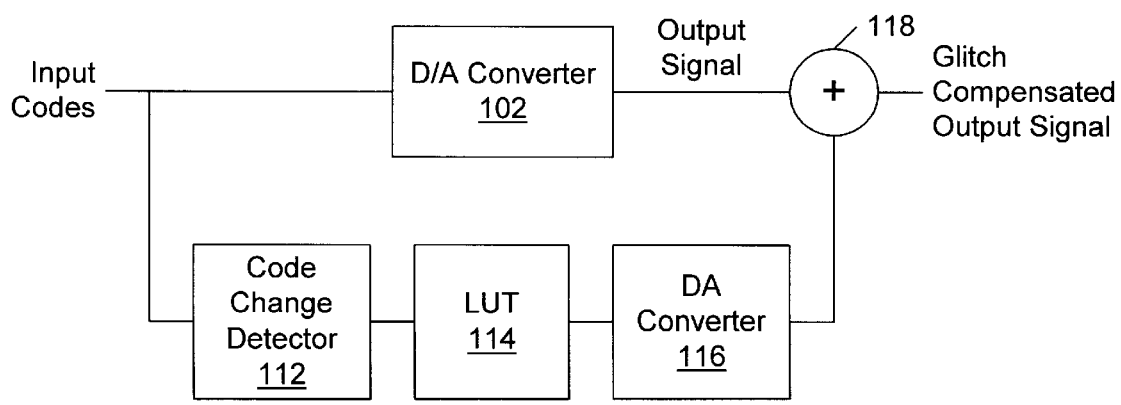
FIG. 2 illustrates a system for compensating for glitch errors in a D/A converter according to the present invention.

A system for compensating for glitch according to the present invention can use either analog compensation techniques at the output of the D/A converter, or digital compensation at the input of the D/A converter FIG. 2—Glitch Compensation Embodiment (Analog Compensation)

FIG. 2 is a block diagram illustrating the preferred embodiment of the present invention, utilizing analog compensation techniques at the output of the D/A converter 102 which is desired to be compensated for glitch according to the present invention. As shown, the D/A converter 102 receives input sample codes corresponding to a digital signal. The D/A converter 102 converts the input sample codes into an output analog signal as shown.

According to the present invention, the input sample codes which are applied to the input of the D/A converter 102 are also applied to a code change detector 112. The code change detector 112 examines the current code of the current sample being provided to the D/A converter 102. The code change detector 112 determines the code change between the current sample code and the code of an immediately prior sample that was provided to the D/A converter 102. The code change detector 112 also preferably determines whether the current sample code applied to the D/A converter 102 will result in a glitch in the output produced by the D/A converter 102. In the preferred embodiment, if the code change between the current sample code and the immediately prior sample code indicates that a glitch will result, the code change detector 112 outputs the code change to a lookup table 114.

In general, the determination as to whether a glitch signal will result depends on the code change or transition between the current code of a current sample and a code of an immediately prior sample. For certain code changes, such as a transition from 01111111 to 10000000, or a transition from 00111111 to 01000000, the glitch signal can be fairly large, primarily due to the large number of switches or changes in the current generators.

The lookup table 114 stores a plurality of compensation codes which are operable to produce compensation signals. The code change is used to index into the lookup table to obtain the proper compensation code. Thus, the lookup table 114 is preprogrammed with the types of glitches that can result for each type of code change and includes compensation codes for each of these types of glitches. The code change detected by the code change detector 112 indexes into the look-up table to obtain the appropriate compensation code.

Figure 5:
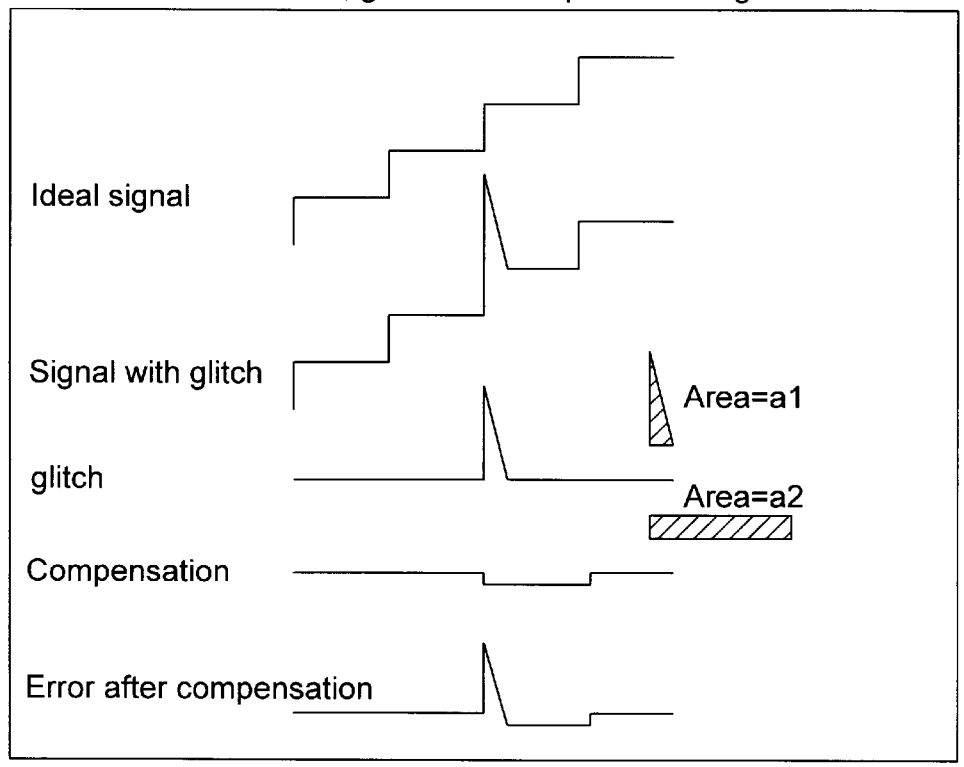
FIG. 5 illustrates various D/A converter, glitch and compensation signals.

The look-up table 114 outputs a compensation code to an auxiliary D/A converter 116. The auxiliary D/A converter 116 receives the compensation code and produces the compensation signal which is provided to a summing node 118. The summing node 118 sums the output signal from the D/A converter 102 and the compensation signal output from the auxiliary D/A converter 116 to produce a glitch compensated output signal. Referring ahead briefly to FIG. 5, the glitch compensated output signal essentially comprises the "signal with glitch" shown in FIG. 5 summed with the "compensation" signal shown in FIG. 5.

In the analog compensation embodiment of FIG. 2, the auxiliary D/A converter 116 compensates the main D/A converter 102 for the glitch errors in the main D/A converter 102. The analog compensation signal may also compensate for other errors as well, such as static linearity errors. The auxiliary D/A converter 116 is sampled at the same time as the main D/A converter 102. The auxiliary D/A converter 116 is fed by digital circuitry that calculates its output from the information from the input sample codes applied to the main D/A converter 102 and the values of the compensation stored in look up tables. Since the needed compensation is much smaller than the signal generated by the main D/A converter 102, the auxiliary D/A converter output is scaled down compared to the output of the main D/A converter 102. Also, the auxiliary D/A converter 116 does not require the same accuracy as the main D/A converter 102.

Figure 3:
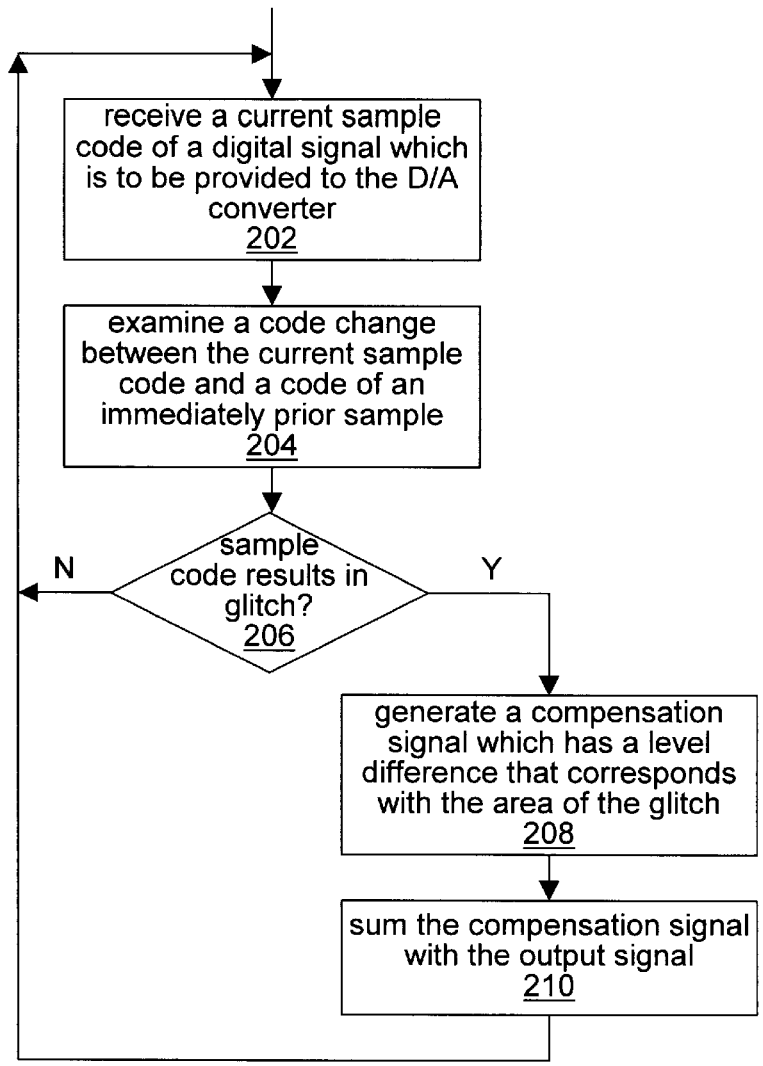
FIG. 3 is a flowchart diagram illustrating operation of the D/A converter of FIG. 2.

FIG. 3—Flowchart Diagram

FIG. 3 is a flowchart diagram illustrating operation of the analog compensation embodiment of the present invention. As shown, the present invention comprises a method for compensating for glitch errors in a digital to analog converter, such as D/A converter 102 in FIG. 2.

In step 202 the method receives a plurality of samples codes of a digital signal which are to be provided to the digital to analog (D/A) converter 102. In step 204 the method then examines a code change between the current sample code and a code of an immediately prior sample.

If the code change indicates that the output of the D/A converter 102 will include a glitch as determined in step 206, i.e., that the current sample code applied to the D/A converter 102 will result in a glitch, then in step 208 the method generates a compensation signal. The generated compensation signal has a level difference which corresponds with the area of the glitch. As noted above, the compensation signal is preferably generated using a look-up table, wherein the input to the look-up table is the code change between the current sample code and the code of the prior sample, and the output is a compensation code. The compensation code is applied as an input to the auxiliary D/A converter 116 to produce the compensation signal.

During this time, the D/A converter 102 generates an output signal in response to the current sample, wherein the output signal includes the glitch. In step 210 the method sums the compensation signal with the output signal to produce the glitch compensated output signal. This summation operates to adjust the output signal from the D/A converter to compensate for the glitch, wherein this adjustment comprises modifying the level of the output signal with a level difference which corresponds with the area of the glitch. In the preferred embodiment, the level difference comprises the area of the glitch divided by the time duration of the sample.

Constructing the Glitch Error Compensation Circuit

The method of the present invention also includes a method of constructing a glitch error compensation circuit for correcting glitch errors in a D/A converter. This method comprises first determining one or more glitch signals generated by the D/A converter. The method then determines an area of each of the glitch signals. The method then constructs a glitch error compensation circuit which corrects for glitch errors in the D/A converter. The glitch error compensation circuit is operable to generate an output compensation signal which has a level difference that corresponds with the area of a detected glitch signal, wherein the output compensation signal is useable to compensate for the detected glitch.

Constructing the glitch error compensation circuit includes representing the glitch signal as a constant deviation during the sample period of the glitch, wherein the constant deviation has substantially the same area as the determined area of the glitch signal. The glitch error compensation circuit is operable to receive an output from the digital to analog converter and produce new output values which include the constant deviation during the sample period of the glitch.

In the preferred embodiment, constructing the glitch error compensation circuit includes creating a look-up table (LUT) which includes pairs of code changes and corresponding compensation codes. The LUT receives as an input the code change between a current sample code and an immediately prior sample code. This code change indexes into the LUT to determine the proper compensation code which is used to compensate for the glitch caused by the code change. The compensation code for each type of code change is in turn determined by the area of the glitch that is produced by the code change.

Figure 4:
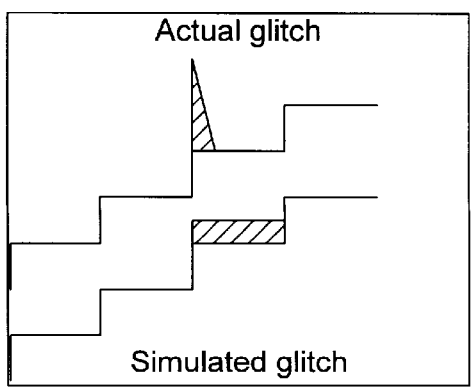
FIG. 4 illustrates actual glitch and a simulated glitch.

FIG. 4—Actual and Simulated Glitch Signals

FIG. 4 illustrates an actual glitch signal and a simulated glitch signal. As shown, the glitch results in a voltage spike for a short amount of time. Glitch is commonly characterized by the area of the glitch (measured in some pVsec). In a sampled system, it is difficult to compensate for glitches because, as shown, the resulting glitched signal does not remain constant during the sample period. However, as shown in FIG. 4, according to the present invention the glitch is represented as a constant deviation during the sample period for the glitch, wherein the area of the deviation remains the same. This approximation in the frequency domain becomes more accurate for lower frequencies and it is especially well suitable in an over-sampled system.

FIG. 5—Signals Involved in Glitch Compensation

FIG. 5 illustrates the different signals involved in glitch compensation. As shown, an ideal signal comprises a smooth stair-step signal. A signal which includes a glitch ("signal with glitch") includes the stair-step signal with a glitch. The glitch signal is also shown separately. Thus, when the glitch signal is added to the ideal signal, the result is the "signal with glitch". As shown, the glitch signal has an area a1. The compensation signal has a level difference at the time of the glitch which has an area of–a2, wherein a2 is approximately equal to a1. The resulting error signal after the compensation is also shown in FIG. 5.

Digital Compensation

Figure 6:
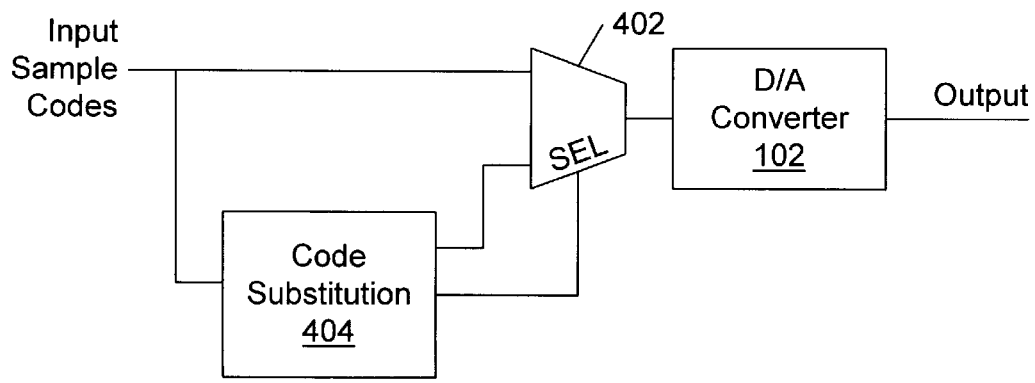
FIG. 6 illustrates a system a system for compensating for glitch errors in a D/A converter using digital techniques.

FIG. 6 is a block diagram illustrating an alternate embodiment of the present invention, utilizing digital compensation techniques at the input of the D/A converter 102 which is desired to be compensated for glitch according to the present invention. In FIG. 6, items which are similar or identical to items in FIG. 2 have the same reference numerals for convenience.

As shown, input sample codes are provided to a first input of a two input multiplexer 402. The input sample codes are also provided to a code substitution unit 404. The code substitution unit 404 examines the current code of the current sample being provided to the D/A converter 102 and determines the code change between the current sample code and the code of an immediately prior sample that was provided to the D/A converter 102. The code substitution unit 404 also preferably determines whether the current sample code applied to the D/A converter 102 will result in a glitch in the output produced by the D/A converter 102.

In the preferred embodiment, if the code change between the current sample code and the immediately prior sample code indicates that a glitch will result, the code substitution unit 404 adjusts or manipulates the code to reduce or minimize the glitch. This adjusted code is then provided as an output of the code substitution unit 404 to the second input of the multiplexer 402. The code substitution unit 404 also provides a select signal to the multiplexer 402 to select this new adjusted code as the new input to the D/A converter 102.

Therefore, in digital compensation the glitch compensation is instead subtracted or adjusted at the input of the D/A converter 102. However, a possible conflict exists because this subtraction alters the code to D/A converter and therefore possibly also the glitch itself. In this case, it may be necessary to compensate the glitch during several samples.

EXAMPLE 1

Provide the Following Codes to an 8 bit D/A Converter:
N(0)=73 Hex
N(1)=88 Hex
N(2)=85 Hex
N(3)=93 Hex The D/A converter is known to produce a glitch when MSB goes from 0 to 1 with an equivalent area 5 Hex times the conversion time, so code N(1) is altered to 88 Hex–5 Hex=83 Hex. This results in the following codes:
N(0)=73 Hex
N(1)=83 Hex
N(2)=85 Hex
N(3)=93 Hex

EXAMPLE 2

Provide the Following Codes to the D/A Converter in Example 1:
N(0)=73 Hex
N(1)=83 Hex
N(2)=85 Hex
N(3)=93 Hex Using the same method as in example 1, N(1) is required to be altered to 83 Hex–5 Hex =7E Hex. However, this input value does not cause any glitch since MSB stays at zero during N(1) and N(2). Instead, the method subtracts 3 Hex from N(1) and then 2 Hex from N(2).

Numerous variations and modifications will become apparent to those skilled in the art once the above disclosure is fully appreciated. It is intended that the following claims be interpreted to embrace all such variations and modifications.

What is claimed is:

1. A method for compensating for glitch errors in a digital to analog converter, the method comprising:

receiving a plurality of samples of a digital signal which are to be provided to a digital to analog (D/A) converter, wherein each sample comprises a code;

examining a code change between a current code of a current sample and a code of an immediately prior sample;

determining that the current sample applied to the D/A converter results in a glitch in the D/A converter in response to said examining;

wherein the D/A converter generates an output signal in response to the current sample, wherein the output signal includes the glitch;

adjusting the output signal from the D/A converter to compensate for the glitch, wherein said adjusting comprises modifying a level of the output signal with a level difference which corresponds with the area of the glitch.

2. The method of claim 1, further comprising:

determining the area of the glitch prior to said adjusting the output signal.

3. The method of claim 2, wherein the level difference comprises the area of the glitch divided by the time duration of the sample.

4. The method of claim 2, wherein said determining the area of the glitch utilizes the code change between said current code and the code of the prior sample.

5. The method of claim 1, wherein said adjusting the output signal from the D/A converter comprises:

generating a compensation signal, wherein the compensation signal has a level difference which corresponds with the area of the glitch;

summing the compensation signal with the output signal.

6. The method of claim 1, wherein said adjusting the output signal from the D/A converter includes:

determining a code corresponding to the level difference in response to the code change;

providing the code corresponding to the level difference to a second D/A converter;

the second D/A converter outputting a compensation signal;

adjusting the output signal using the compensation signal.

7. The method of claim 6, wherein said determining the code comprises applying the code change to a look-up table (LUT), wherein the LUT provides the code corresponding to the level difference.

8. The method of claim 1, wherein said adjusting the output signal from the D/A converter includes:

determining a type of glitch in response to the code change;

determining a code corresponding to the level difference in response to the type of glitch;

providing the code corresponding to the level difference to a second D/A converter;

the second D/A converter outputting a compensation signal;

adjusting the output signal using the compensation signal.

9. The method of claim 8, wherein said determining the code comprises applying the type of glitch to a look-up table (LUT), wherein the LUT provides the code corresponding to the level difference.

10. A method for compensating for glitch errors in a digital to analog converter, the method comprising:

receiving a plurality of samples of a digital signal which are to be provided to a digital to analog (D/A) converter, wherein each sample comprises a code;

examining a code change between a current code of a current sample and a code of an immediately prior sample;

determining that the current sample applied to the D/A converter results in a glitch in the D/A converter in response to said examining;

wherein the D/A converter generates an output signal in response to the current sample, wherein the output signal includes the glitch;

generating a compensation signal in response to the code change;

adjusting the output signal from the D/A converter using the compensation signal, wherein said adjusting compensates for the glitch.

11. The method of claim 10, wherein the compensation signal includes a level difference which corresponds with the area of the glitch.

12. The method of claim 11, wherein said adjusting operates to modify a level of the output signal with a level difference which corresponds with the area of the glitch.

13. The method of claim 11, wherein said adjusting comprises summing the compensation signal and the output signal.

14. The method of claim 1, further comprising:

determining the area of the glitch prior to said adjusting the output signal.

wherein the level difference comprises the area of the glitch divided by the time duration of the sample.

15. A system for compensating for glitch errors in a digital to analog (D/A) converter, the system comprising:

a glitch detection circuit including an input for receiving a plurality of samples of a digital signal which are to be provided to the digital to analog (D/A) converter, wherein each sample comprises a code, wherein the glitch detection circuit examines a code change between a current code of a current sample and a code of an immediately prior sample and determines whether the current sample applied to the D/A converter results in a glitch in the D/A converter, wherein the glitch detection circuit generates a compensation code in response to a detected glitch;

a compensation D/A converter coupled to the glitch detection circuit which receives the compensation code and generates a compensation signal;

wherein the D/A converter generates an output signal in response to the current sample, wherein the output signal includes the glitch;

a summer which sums the output signal and the compensation signal, thereby adjusting the output signal from the D/A converter to compensate for the glitch, wherein said adjusting comprises modifying a level of the output signal with a level difference which corresponds with the area of the glitch.

16. The system of claim 15, wherein the compensation signal includes a level difference which corresponds with the area of the glitch.

17. The system, of claim 15, wherein the glitch detection circuit includes a look-up table which receives the code change and outputs a compensation code in response thereto.

18. A system for converting digital signals to analog signals, comprising:

a digital to analog converter which receives a plurality of samples of a digital signal and produces corresponding analog signals, wherein the digital to analog converter outputs a glitch signal included with said analog signals, wherein said glitch signal has an area;

a glitch detection circuit including an input for receiving the plurality of samples of a digital signal which are provided to the digital to analog (D/A) converter, wherein each sample comprises a code, wherein the glitch detection circuit examines a code change between a current code of a current sample and a code of an immediately prior sample and determines whether the current sample applied to the D/A converter results in a glitch in the D/A converter, wherein the glitch detection circuit generates a compensation signal in response to a detected glitch;

wherein the D/A converter generates an output signal in response to the current sample, wherein the output signal includes the glitch;

a summer which sums the output signal and the compensation signal, thereby adjusting the output signal from the D/A converter to compensate for the glitch, wherein said adjusting comprises modifying a level of the output signal with a level difference which corresponds to the area of the glitch.

19. The system of claim 18, wherein the compensation signal includes a level difference which corresponds with the area of the glitch.

20. The system, of claim 18, wherein the glitch detection circuit includes a look-up table which receives the code change and outputs the compensation signal in response thereto.

21. A method of constructing a glitch error compensation circuit for correcting glitch errors in a digital to analog converter, the method comprising:

determining one or more glitch signals generated by a the digital to analog converter;

determining an area of each of the glitch signals;

constructing a glitch error compensation circuit which corrects for glitch errors in the digital to analog converter, wherein the glitch error compensation circuit is operable to generate an output compensation signal which has a level difference that corresponds with the area of a detected glitch signal, wherein the output compensation signal is usable to compensate for the detected glitch.

22. The method of claim 21, wherein said constructing the glitch error compensation circuit includes representing the glitch signal as a constant deviation during the sample period of the glitch, wherein said constant deviation has the same area as the determined area of the glitch signal, wherein the glitch error compensation circuit is operable to receive an output from the digital to analog converter and produce new output values which include said constant deviation during the sample period of the glitch.

23. The method of claim 21, wherein said constructing the glitch error compensation circuit includes connecting the glitch error compensation circuit to receive sample code inputs to the D/A converter;

wherein the glitch error compensation circuit is operable to examine a code change between a current code of a current sample and a code of an immediately prior sample and determine that the current sample applied to the D/A converter results in a glitch in the D/A converter in response to said examining.

* * * * *